United States Patent
Haag et al.

(10) Patent No.: US 7,307,561 B2
(45) Date of Patent: Dec. 11, 2007

(54) METHOD AND DEVICE FOR FUNCTIONALLY TESTING AN ANALOG TO-DIGITAL CONVERTER AND A CORRESPONDING ANALOG-TO-DIGITAL CONVERTER

(75) Inventors: Wolfgang Haag, Winnenden (DE); Claus Steinle, Stuttgart (DE); Stefan Keller, Eberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 685 days.

(21) Appl. No.: 10/509,639

(22) PCT Filed: Apr. 2, 2003

(86) PCT No.: PCT/DE03/01081

§ 371 (c)(1),
(2), (4) Date: Sep. 29, 2004

(87) PCT Pub. No.: WO03/085834

PCT Pub. Date: Oct. 16, 2003

(65) Prior Publication Data

US 2005/0154945 A1 Jul. 14, 2005

(30) Foreign Application Priority Data

Apr. 8, 2002 (DE) ................................ 102 15 405

(51) Int. Cl.
*H03M 1/10* (2006.01)
(52) U.S. Cl. ...................... 341/120; 341/118
(58) Field of Classification Search ................ 341/120, 341/118, 155, 159
See application file for complete search history.

(56) References Cited

U.S. PATENT DOCUMENTS

| | | | | |
|---|---|---|---|---|
| 5,661,481 A | * | 8/1997 | Muramatsu | 341/120 |
| 5,861,829 A | * | 1/1999 | Sutardja | 341/122 |
| 6,396,426 B1 | * | 5/2002 | Balard et al. | 341/120 |
| 6,411,233 B1 | * | 6/2002 | Sutardja | 341/120 |
| 6,549,150 B1 | * | 4/2003 | Bulaga et al. | 341/120 |

(Continued)

FOREIGN PATENT DOCUMENTS

DE     195 13 081     10/1996

(Continued)

OTHER PUBLICATIONS

Patent Abstracts of Japan, vol. 014, No. 194 (E-0919), Apr. 20, 1990.

(Continued)

*Primary Examiner*—Linh V. Nguyen
(74) *Attorney, Agent, or Firm*—Kenyon & Kenyon LLP

(57) ABSTRACT

A method and device for function testing an analog-digital converter, the analog-digital converter performing a function for converting at least one analog signal into at least one digital signal using a first predetermined reference voltage, wherein the analog-digital converter is able to perform the function alternatively using at least one other reference voltage, in particular a predetermined second reference voltage, the analog-digital converter being blocked to prevent use of at least the other reference voltage, in particular the second reference voltage, by the analog-digital converter, a predetermined analog signal being converted into a digital signal for the function test and the digital signal being analyzed.

19 Claims, 3 Drawing Sheets

U.S. PATENT DOCUMENTS

| | | | |
|---|---|---|---|
| 6,703,960 B2 * | 3/2004 | Kressin | 341/159 |
| 7,046,180 B2 * | 5/2006 | Jongsma et al. | 341/141 |
| 7,154,422 B2 * | 12/2006 | Wen | 341/120 |
| 7,176,816 B2 * | 2/2007 | Koerner et al. | 341/120 |
| 7,268,712 B1 * | 9/2007 | Sheen | 341/120 |
| 2007/0175624 A1 * | 8/2007 | Affolter et al. | 165/287 |

FOREIGN PATENT DOCUMENTS

| | | |
|---|---|---|
| EP | 0 474 024 | 3/1992 |
| JP | 02 041029 | 2/1990 |
| WO | WO 96 31690 | 10/1996 |
| WO | WO 01 10031 | 2/2001 |
| WO | WO 02 15404 | 2/2002 |

OTHER PUBLICATIONS

"PC gesteuerte Messtechnik . . . " ["PC-controlled measuring technology . . . "] by Klaus Dembowski, Markt—und Technik Verglag, 1993. (No Abstract).

* cited by examiner

METHOD AND DEVICE FOR FUNCTIONALLY TESTING AN ANALOG TO-DIGITAL CONVERTER AND A CORRESPONDING ANALOG-TO-DIGITAL CONVERTER

FIELD OF THE INVENTION

The present invention relates to a method and a device for function testing an analog-digital converter and an analog-digital converter according to the definitions of the species in the independent claims.

DESCRIPTION OF RELATED ART

Analog-digital converters are known in a variety of forms, e.g., as described in "PC gesteuerte Messtechnik . . . " ["PC-controlled measuring technology . . . "] by Klaus Dembowski, Markt-und Technik Verlag, 1993.

A method and a device for function testing an analog-digital converter is also known from German Patent 195 13 081 A1, where a set test voltage is converted by the analog-digital converter. This test voltage is generated by a voltage divider, which is supplied with the same internal voltage as the reference voltage of the analog-digital converter. The analog-digital converter has exactly one intended reference voltage. To detect a faulty reference voltage, the converted test voltage value is checked as to whether it corresponds to a known setpoint value within an allowed tolerance band.

SUMMARY OF THE INVENTION

According to the present invention, for various signals, e.g., in a control unit in a vehicle in particular, it would be desirable to convert certain ranges of the signal or even the entire signal at a higher resolution. To do so, not only should one fixed reference voltage be used for an analog-digital converter, but instead more than one reference voltage should be used. Thus according to the present invention, analog-digital converters are designed or configured and/or operated with software support, so that it is possible to use at least two reference voltages for the analog-digital converter. Thus not just one fixed reference voltage is made available in the control unit, as in the related art, but instead at least two different reference voltages are made available.

It is likewise possible according to the present invention to select, i.e., to impress one of these reference voltages, in particular via software, on any analog-digital conversion on any analog-digital channel. With these novel functionalities according to the present invention, error patterns that could not occur in previous computer generations but must be controlled in the interest of safety are now also possible because a faulty internal reference voltage in an analog-digital converter will yield the wrong conversion result, which may have substantial consequences in the case of safety-critical signals, e.g., signals from the accelerator pedal module in a vehicle; in the concrete example, such consequences might include faulty acceleration, for example.

Other examples and more concrete scenarios in this regard follow in the description of the exemplary embodiments.

It should be emphasized that with the previous analog-digital converter test method, i.e., the previous function test, it has not been possible to detect errors that result in unwanted switching and thus in an incorrect reference voltage.

Therefore, in addition to permitting conversion of a signal with the assistance of multiple references, the object of the present invention is also to reliably detect possible errors and to initiate and/or implement a suitable error response.

The present invention is directed to a method and a device for function testing an analog-digital converter ADC, the analog-digital converter ADC performing a function for converting at least one analog signal into at least one digital signal using a first predetermined reference voltage as well as a corresponding analog-digital converter.

The analog-digital converter is advantageously designed in such a way that the conversion function may alternatively be performed using at least one other reference voltage, in particular a predetermined second reference voltage, the analog-digital converter being blocked for the function test to prevent use of at least the other reference voltage, in particular the second reference voltage, by the analog-digital converter, and a predetermined analog signal is appropriately converted into a digital signal for the function test, this digital signal being analyzed.

An analog signal is advantageously converted using the first reference voltage and, for the function test (standard test), the digital signal converted using the first reference voltage is analyzed with an expected predetermined signal using the first reference voltage.

In an advantageous embodiment, the analog signal is converted using the first reference voltage but, for the function test (cross-test), the digital signal converted using the first reference voltage is analyzed with an expected predetermined signal using the second reference voltage.

The digital signal converted from the analog signal may be advantageously compared with the corresponding expected signal or the reference voltage used may be determined from the digital signal and this is then compared with an expected predetermined reference voltage.

Depending on the comparison of the determined reference voltage with the at least one predetermined reference voltage or depending on the comparison of the digital signal converted from the predetermined analog signal with the at least one expected signal, it is then possible to detect errors and initiate a predetermined error response.

The error response may appropriately occur when no correspondence is achieved in the comparison within a predeterminable tolerance or when a correspondence is achieved in the comparison within a predeterminable tolerance.

In an advantageous embodiment, the at least one first analog signal is converted as a first group of first signals and at least one second analog signal is converted as a second group of second signals, exactly one reference voltage being assigned to the first signal for conversion in each case.

These two groups may then be appropriately allocated unambiguously to two analog-digital converter arrays and/or a first analog-digital converter and a second analog-digital converter. Therefore, the only analog-digital converter subjected to the function test by blocking is advantageously the one in which this at least one analog signal is to be converted using only one reference voltage.

The function test is appropriately performed on a predetermined analog test signal, the function test being performed exclusively on the predetermined analog test signal in a particular embodiment.

In an appropriate embodiment, an analog-digital converter according to the aforementioned advantages may be operated in two modes, a first mode allowing the use of different reference voltages for conversion and a second mode allowing only one reference voltage for conversion.

Advantageously there is in particular a software-based assignment of reference voltages by at least two values for different reference voltages which are stored in a table in a memory, one reference voltage being predetermined for use in the conversion by selecting a value.

The function test may then be performed appropriately only for the first group, in particular by separating the first and second groups of signals.

A faulty configuration, in particular mode setting of the analog-digital converter, may thus advantageously be detected. This means that a blocked analog-digital converter still has the property of using alternative references instead of not using them, i.e., the blockage does not function.

In addition, advantageously not all analog-digital channels need to be tested individually for a wrong reference voltage by securing the analog-digital converter mode. It is sufficient to test the property of the mode as an example on one channel, in particular on the test voltage channel, this mode acting equally on all analog-digital channels of an analog-digital converter and/or an analog-digital converter array, in particular due to the hardware.

The detection according to the present invention of a wrong mode setting in the novel method, which would allow a reference switching on safety-relevant analog-digital channels, makes use of an additional reference voltage permissible from a technical safety standpoint. Use of the additional reference voltage, i.e., reference, results in a substantial reduction in material costs because circuit parts, such as, for example, a four-channel amplifier of an actual value potentiometer which were previously discretely constructed in the hardware, may be replaced by software, i.e., by conversion using a ¼ reference.

This method is implementable in principle without any additional hardware expenditure, in particular in comparison with the previous test voltage method as described in the "Background Information."

This method is also advantageously implementable even with a very low complexity in terms of software.

In addition, there is a clear-cut diagnosis, i.e., an error allocation to the analog-digital converter which is independent of components.

In other words, a wrong reference, i.e., a wrong analog-digital converter mode, is detected on the basis of an actual analog-digital conversion, in particular a test voltage. This is more reliable in terms of monitoring technology, i.e., no additional information from the mode registers or configuration registers need be used for the analysis because although this information could be read out correctly, it is impossible to detect from it whether the defective analog-digital converter is processing it incorrectly internally.

In addition, the previous error detection mechanisms are advantageously covered, the method is thus an expansion of the test voltage method because, for example, analog-digital converters are able to detect slope and offset errors or hanging bit positions in the analog-digital converter result due to the deviation from the setpoint value of the test voltage in particular.

Other advantages and advantageous embodiments are derived from the description and the features of the claims.

BRIEF DESCRIPTION OF THE DRAWINGS

The present invention will be described in greater detail with reference to the following drawings wherein.

DETAILED DESCRIPTION OF THE INVENTION

The computer generations according to the present invention, such as computer unit 100 in this case, not only have a fixed reference voltage UREF such as 5 V but also have two or possibly more different reference voltages UREF1 and UREF2, etc. for use in analog-digital conversion. According to the present invention, there is also the possibility of selecting, i.e., impressing one of these reference voltages via software on any analog-digital conversion on any analog-digital channel.

This results in novel error patterns that could not occur in previous computer generations but must be controlled in the interest of safety because a faulty internal reference voltage in an AD converter will yield the wrong converter result.

In other words, as the starting point for various signals in the control unit it is advantageous to convert certain ranges of the signal at a higher resolution. An example of this is the throttle valve signal in the idling range of a vehicle, which today is electrically amplified repeatedly and input again, or it may be the engine temperature sensor to achieve a higher resolution, e.g., at 100 degrees. The critical error pattern is obtained from the monitoring standpoint, i.e., that the presence of the conversion using different reference voltages at other signals such as the information from the accelerator pedal module, could result in, for example, both channels of the accelerator pedal module being input with amplification so that the vehicle itself would be accelerated, for example.

Figure 1:
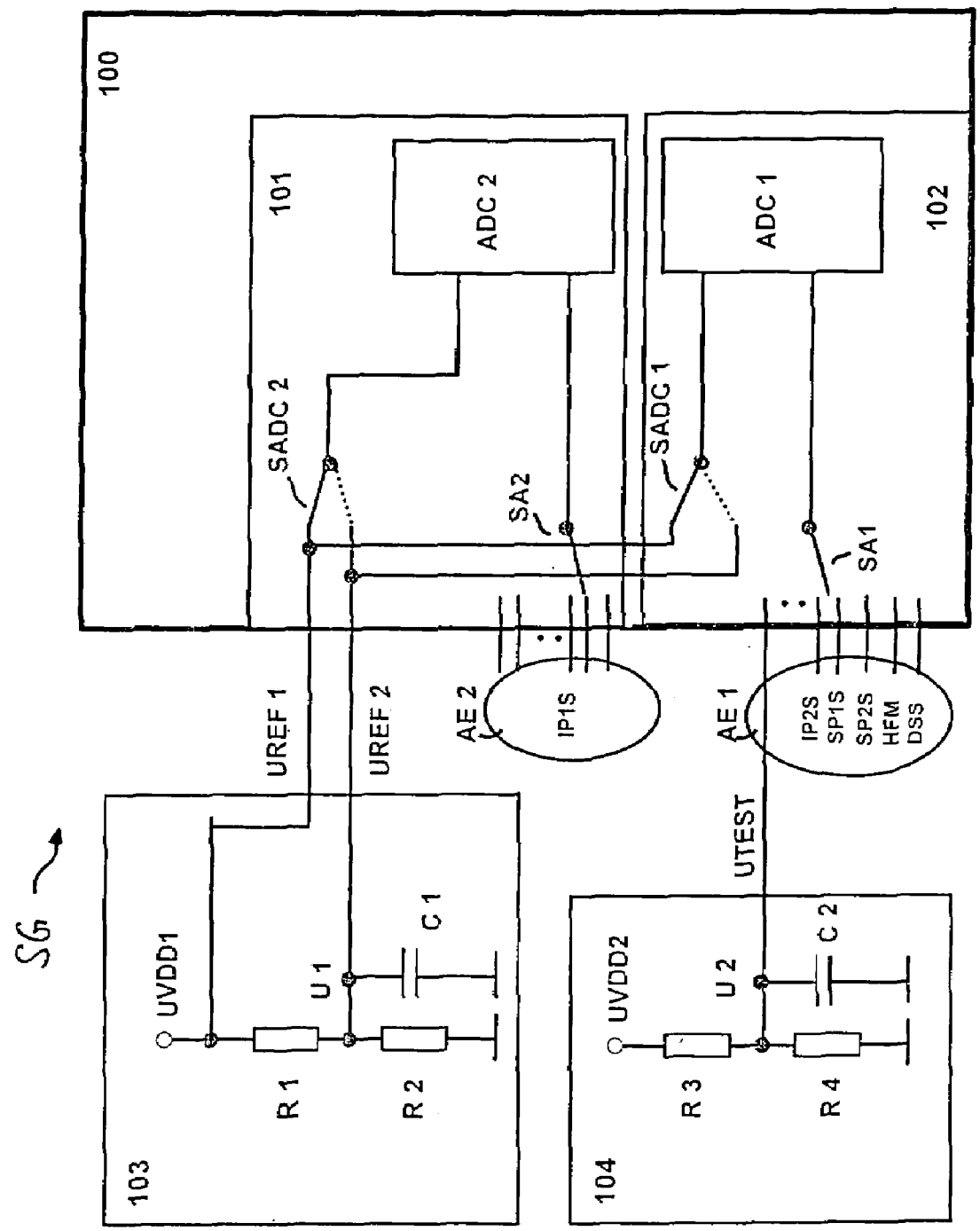
FIG. 1 shows a detail of a control unit showing parts essential to the present invention.

If an error causes conversion using a wrong reference on multiple channels such as SP1S and SP2S in FIG. 1, then the conversion result on each of these channels is wrong by the same gain factor. The previous monitoring functions for safeguarding these signals are based on a plausibility check of two signals which then cannot detect such errors because their ratio to one another remains the same but the value, however, is wrong.

Such a faulty reference voltage, i.e., reference, may occur due to short circuits on the circuit board in the control unit, a high resistance on the pin of the IC, i.e., the integrated circuit, and due to cold solders or bonds, a memory error resulting in the wrong analog-digital converter configuration or internal defects in the integrated circuits on the computer and/or the analog-digital converter silicon chip. Likewise, a wrong reference value of the usable reference values may be used or a wrong reference voltage may be used.

Such errors must be reliably detectable since, in vehicle control units, in particular in engine control units in the vehicle, safety-relevant signals, such as the driver's intent imparted via the accelerator pedal, are converted by the analog-digital converter, and these values [are used by] the control unit directly to set a corresponding engine torque in the vehicle engine. This is true in particular for excessively high values because these could result in spontaneous acceleration, an uncontrollable driving state or risk to persons. This is likewise true of safety-critical situations in other applications, e.g., in automation or in the machine tool field, etc.

In the previous analog-digital converter test methods, errors that result in unwanted switching and thus to a wrong reference are not detectable. The present invention thus fulfills the object defined above of reliably detecting these errors and thus executing corresponding error responses. Such an error response may be, for example, a targeted power reduction in the case of engine control.

FIG. 1 shows parts of a control unit SG which are essential to the present invention, showing a computer unit or control unit 100, in particular a processor or microcomputer, containing integrated circuits 101 and 102, which in turn contain analog-digital converters ADC1 and ADC2, respectively. In addition, switching devices SADC2 and SADC1 for switching between two reference voltages UREF1 and UREF2 are also shown. Various analog input (channel) groups AE2 and/or AE1 are reversible by the switches shown here for analog signals SA1 and SA2, respectively.

Reference voltages UREF1 and UREF2 are obtained from a reference voltage generator 103. This shows a basic power supply voltage UVDD1 which in this example corresponds to UREF1. A voltage U1, i.e., UREF2, may then also be obtained from block 103 via a voltage divider having resistors R1 and R2 and a connected capacitor C1. In addition to using voltage dividing in the example in block 103 shown here, any other possibility of generating the reference voltage, such as different voltage sources or an actual reference voltage generator, etc., is also conceivable according to the present invention for generating at least two reference voltages.

The same is also true for generating test voltage UTEST in block 104. This shows a power supply voltage UVDD2 which may be the same as or different from UVDD1. A voltage U2 corresponding here to test voltage UTEST is achieved again by voltage dividing. This also shows a capacitor C2. Here also, test voltage UTEST may be generated in any way, e.g., by voltage dividing, but there are also other possibilities, as indicated above.

A faulty internal reference voltage in an analog-digital converter ADC results in the wrong conversion result although physically the voltage on the analog-digital channel is unchanged. Analog-digital converter ADC always converts the analog voltage in relation to its reference voltage (ratiometrically). If the reference voltage is too low by a factor of 4, for example, as in the desired application in control unit SG mentioned above, then the conversion result will be too large by a factor of 4.

Control unit SG shown here is an engine control unit in a motor vehicle, for example, or some other control unit in a vehicle and/or in the machine tool area or in automation is also conceivable. A microcontroller 100 having (in this example) two reference voltage inputs (UREF1 and UREF2) is used there. For example, a voltage of 5 V, i.e., UREF1 here, is applied at the standard reference voltage input. The alternative reference voltage of 1.2 V, for example, generated via a voltage divider is applied to second alternative reference voltage input UREF2. For other applications, other voltage values are also conceivable. This yields an exemplary dimensioning of the modules in the voltage divider in block 103 of R1 at 31.6 kΩ, R2 at 10 kΩ, and C1 at 100 nF (for UREF1 of 5V and UREF2 of 1.2V).

Microcontroller 100 has two analog-digital converter arrays or analog-digital converters ADC1 and/or ADC2, each with 16 analog-digital channels, for example, on the computer chip. The analog inputs and/or analog channels are labeled as AE2 for ADC2 and one is labeled as IP1F, for example. These are switchable via switch SA2. Analog inputs AE1 or analog-digital channels AE1 include channels UTEST, IP2S, SP1S, SP2S, HFM, and DSS, etc. These include, for example, sensor signals of hot-film air-mass meters HFM or rotational speed signals such as DSS as well as signals from other sensors or other control units or users as part of a control unit assembly. The function test may be performed using at least one of these signals, in particular the test signal.

The test signal with which, for example, the function test may be performed, as described in greater detail below, is generated in block 104, e.g., here again via a voltage divider, using R3, R4 from a voltage UVDD2. Here again, for example, a dimension is selected with R3=3.83 kΩ and R4=10 kΩ and C2=22 nF, which results in a test voltage UTEST of 3.6 V.

Figure 2:
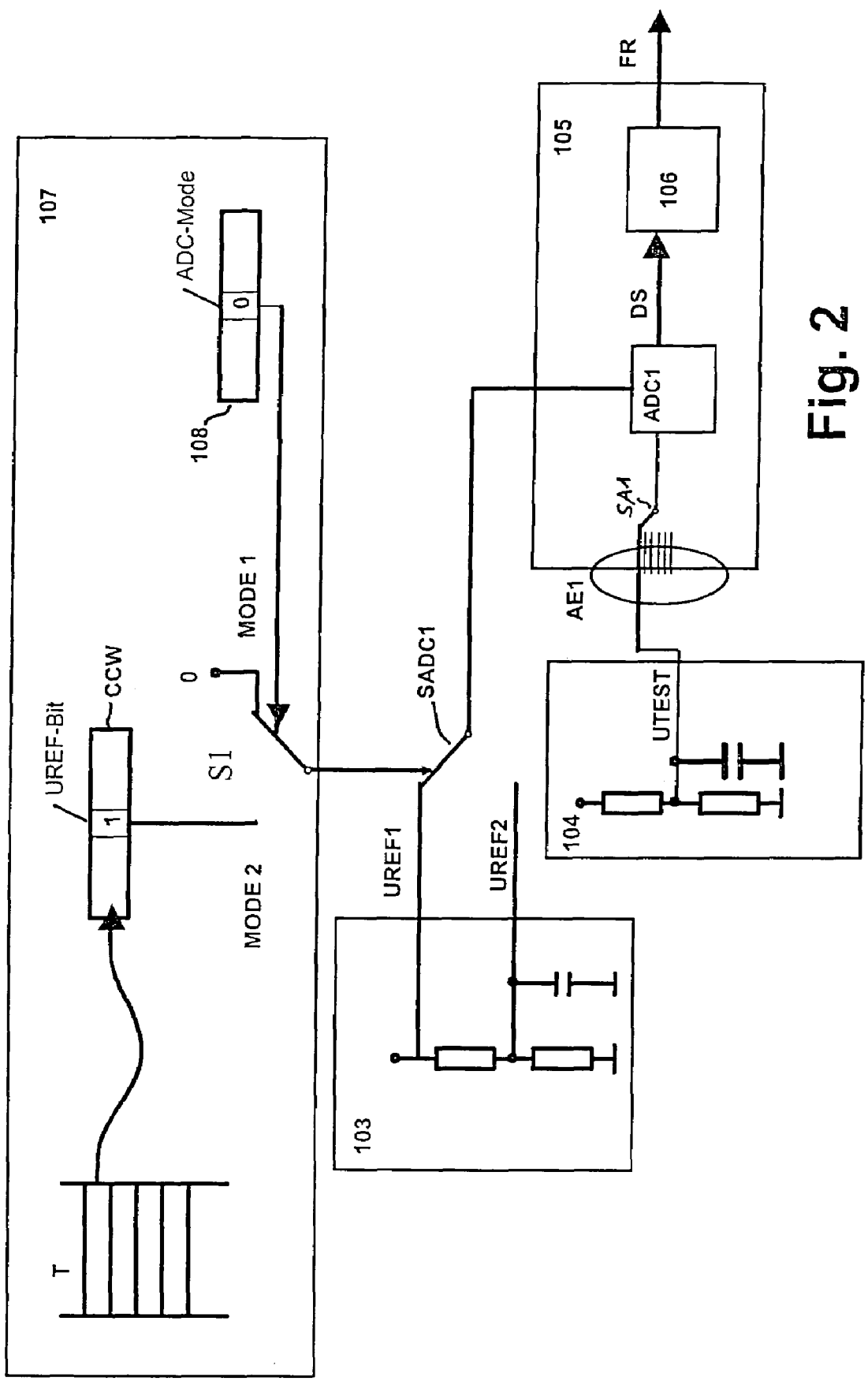
FIG. 2 discloses the method according to the present invention on the basis of a device shown in the form of a block diagram.

The actual test method and/or the function test and the mode settings are now described on the basis of FIG. 2. Two modes, i.e., two mode settings, are available in block 107, i.e., MODE1 and MODE2, each determining the property of the analog-digital converter with respect to the reference voltage for a complete array, i.e., for 16 analog-digital channels, for example. MODE1 means that all analog-digital channels of the array are blocked for analog-digital conversions using UREF2. MODE2 means that all analog-digital channels of the array are able to perform analog-digital conversions using UREF1 or UREF2. Shown here, it is possible to select between two references UREF1 and UREF2 here for each analog-digital conversion via the software in operation in MODE2. To do so, all analog-digital conversions that are to be executed are defined in a table T, in particular in a table in a memory, a memory table T, the memory likewise being in the control unit, in particular in microcontroller 100.

By setting a certain bit position, e.g., in a register CCW, the desired reference voltage may be selected and then used in this conversion. The bit position used in this example is the UREF-BIT which is sufficient in this example because only two reference voltages are used. When using multiple reference voltages, multiple bits are to be selected accordingly. Mode switching is performed from a register 108, for example, in which a certain bit, here the ADC mode bit, is set or is not set and thus MODE1 or MODE2 is selected. Here again in selecting multiple modes beyond two, more bits than the one bit would have to be selected for mode switching. Certain modes may thus be assigned different reference voltages that may be used for conversion.

Block 103 again shows the reference voltage generator from FIG. 1. The same is true for the test voltage generator in block 104.

Mode selection is represented symbolically by switch S1 by which switch SADC1 is then influenced for selecting the corresponding reference. Analog inputs AE1 of the analog-digital channels for the analog-digital array and/or analog-digital converter ADC1 are again shown here. This outputs a digital signal DS, which may then be analyzed in block 106, which then yields an error response FR. This is shown in summary in block 105. Blocks 107, 103, 104, and 105 are part of control unit SG; in an advantageous embodiment, blocks 107 and 105 in particular are part of microcontroller 100.

Figure 3:
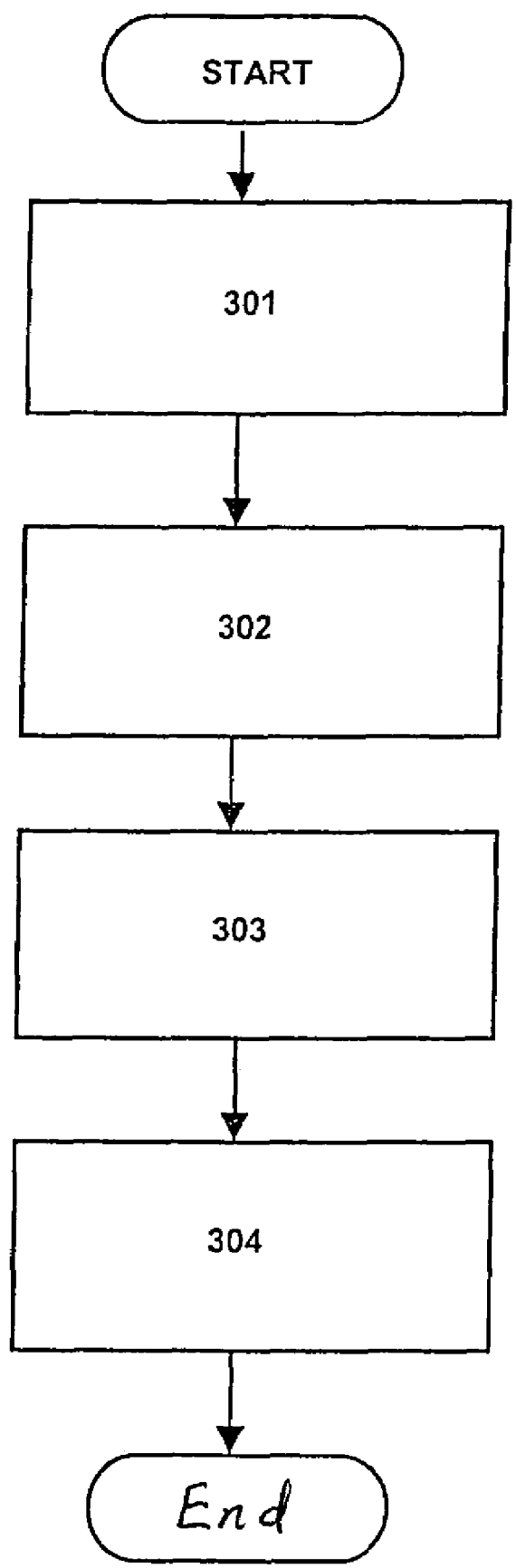
FIG. 3 illustrates once again briefly the method according to the present invention on the basis of a flow chart.

FIG. 3 shows a possible method sequence according to the present invention with reference to FIGS. 1 and 2.

The method includes a hardware design specification to be implemented and a configuration of the analog-digital converter coordinated with it plus a corresponding software run.

The hardware design specification includes first a channel definition where all safety-relevant signals that are to be protected from a wrong reference voltage are applied to an analog-digital converter and/or to an analog-digital converter array (ADC array) such as SP1S, SP2S, IP2S, HFM, and DSS being applied to ADC array ADC1, for example. Test voltage UTEST, with which the correct mode setting for this array may be checked, must then also be applied to this ADC array. All signals that are to functionally use the alternative reference are then applied to at least one other ADC array. In the present application case, this corresponds to an ADC array having 16 analog-digital channels. In other computers and/or analog-digital converters, this may also be a certain ADC channel group on which, despite a fixed specification, an ADC conversion using an alternative reference is not possible. In other words, in addition to an array division, there may also be a division simply into a group of first signals and a group of second signals, etc.

The configuration and the software run occur in block 301 according to FIG. 2, where the analog-digital converter properties of the ADC arrays and/or the signal groups are defined. This is typically performed once in system warmup, i.e., initialization, and is then valid for the entire cycle, in particular a driving cycle. For example, configuration of ADC converter 1 in mode 1, i.e., conversion using an alternative reference, is blocked here and ADC converter ADC2 is operated in MODE2, i.e., conversion using an alternative reference is allowed.

The test voltage, representative of the AE1 group, is then converted in block 302, for example, under specification of an alternative reference voltage. In other words, with the correct mode setting, conversion using the alternative reference is not effective but instead conversion is performed using the standard reference. However, the specification is used as a checking mechanism to detect an erroneously effective mode.

Thereafter, the test voltage is tested in block 303, i.e., the digital value converted from the analog test voltage, in particular with the addition of a tolerance band of UMIN<UTEST<UMAX. This test may be performed by converting the analog signal, in particular test voltage UTEST, using first reference voltage UREF1, as already described under "Advantages," and for the function test, analyzing digital signal DS converted using the first reference voltage with an expected predetermined signal DSREF1 using first reference voltage UREF1 according to a standard test or a standard comparison.

However, an analog signal may also be converted using first reference voltage UREF1, i.e., in particular test voltage UTEST, whereby digital signal DS converted using first reference voltage UREF1 is analyzed for the function test with an expected predetermined signal DSREF2 using second reference voltage UREF2, i.e., a cross-test and/or a cross-comparison.

Error responses may then be derived in both cases of the standard test as well as the cross-test by the fact that identity in the comparison within the range of the tolerance band triggers an error response or the inequality in the range of the comparison triggers an error response.

An error response is thus to be triggered, for example, depending on the application, when DSREF1 not equal to DS with UREF1
DSREF2 equal to DS with UREF1, etc.

where DS should in particular lie within the tolerance band which is obtained in the case of digital signals as DSMIN<DS with UREF1<DSMAX and essentially from tolerances in analog signal UTEST.

With an inequality, a corresponding error response occurs at values in particular outside of the tolerance band. When using the equality criterion, an error response thus occurs at values in particular within the tolerance band. The desired precision may also be achieved by stipulating a tolerance, which in the extreme case may also be given as zero.

Conceivable error responses in block 304 include in particular a reduction in power within the scope of the engine control, initialization of certain emergency operation programs in particular with fixedly set conditions or shutdown of certain functions, etc. The error response may occur as a function of the converted digital signal or the reference voltage calculated back from it, e.g., as a function of the size of the deviation from the expected value, differently from weak measures at a low deviation to shut down of a function and emergency operation at greater deviations. In addition to the tolerance band, other threshold value ranges may also be stipulated for various error responses.

The check may be performed on the basis of a comparison of the digital signals converted from the analog values with a target or setpoint value or by comparison of the reference voltage values in a reverse calculation of the reference voltage from converted digital signal DS.

The configuration of the mode is depicted in FIG. 2 by switch S1. Using this switch it is thus possible to select between the two modes, mode 1 and mode 2. In mode 1 only conversions using the standard reference, e.g., 5 V UREF1 are possible. In mode 2 any AD conversion may be selected according to the definition in table T, a reference voltage selectable here by UREFBIT in register CCW. This is then indicated by switch SADC1.

Since the references are assignable to any analog-digital conversions, a reference check on the test voltage channel normally does not have any relevance regarding the state or the reference of another channel. Plausibility checking of all signals with regard to the correct reference is associated with great complexity or is not feasible. Therefore, the possibility of blocking certain channel groups by a certain mode setting from the ability to convert using an alternative reference is used in the method according to the present invention represented here. Through a suitable choice it is possible to achieve the result that entire channel groups are bound on the whole to a set mode in particular through the computer hardware. If the mode state is checked on a channel, for example, in particular test channel UTEST, one thus recognizes the channel property of entire channel group AE1. Multiple channel groups may be provided, each to be converted using only one reference. A test channel having a corresponding reference should then be provided per channel group. Internal switching, in particular via software, between test channels and the respective references is conceivable.

The mode state is not tested by readout of the ADC mode itself (register 108) but instead an actual analog-digital conversion is used, in particular with the help of the test voltage. The information regarding the mode state is already contained in the conversion result because the analog-digital conversion is performed with the setting for conversion using alternative reference, i.e., UREFBIT=1. Analog-digital conversion may not be performed using alternative reference UREF2 with a correct mode setting MODE1 despite a UREFBIT=1 but instead only using standard reference UREF1 of 5 volt, for example. The result is then correct and corresponds to the expected test voltage value. If the mode setting were defective or if the ADC were to perform an analog-digital conversion using a wrong reference, in particular UREF2, the result would be wrong and this would be discernible immediately from the converted test voltage value. The same is true for an erroneously altered reference as mentioned above which does not correspond to the alternative reference.

The exemplary embodiment represented here should not limit the possibilities according to the present invention but instead should present some possibilities. The method according to the present invention and the device as well as the analog-digital converter extend to all conceivable possibilities here, in particular with respect to the equality and non-equality test in cross-testing and standard testing or in particular the use of different channels and channel groups with one or more references allowed, etc.

What is claimed is:

1. A method for function testing an analog-digital converter, the analog-digital converter performing a function for converting at least one analog signal into at least one digital signal using a first predetermined reference voltage, wherein the analog-digital converter is able to perform the function alternatively using at least one other reference voltage, in particular a predetermined second reference voltage, the analog-digital converter being blocked to prevent use of at least the other reference voltage, in particular the second reference voltage, by the analog-digital converter, a predetermined analog signal being converted into a digital signal for the function test and the digital signal being analyzed.

2. The method according to claim 1, wherein an analog signal is converted using the first reference voltage and, for the function test, the digital signal converted using the first reference voltage is analyzed with an expected predetermined signal using the first reference voltage.

3. The method according to claim 1, wherein an analog signal is converted using the first reference voltage and, for the function test, the digital signal converted using the first reference voltage is analyzed with an expected predetermined signal using the second reference voltage.

4. The method according to claim 1, wherein, for the function test, the reference voltage used for the conversion is determined from the digital signal converted from the predetermined analog signal, and the reference voltage thus determined and used for the conversion is compared with at least one predetermined reference voltage.

5. The method according to claim 1, wherein for the function test, the digital signal converted from the predetermined analog signal is compared with at least one expected digital signal.

6. The method according to claim 4, wherein, depending on the comparison of the determined reference voltage with the at least one predetermined reference voltage, errors are detected and a predetermined error response occurs, the error response being dependent in particular on the reference voltage determined.

7. The method according to claim 5, wherein, depending on the comparison of the digital signal converted from the predetermined analog signal with the at least one expected digital signal, errors are detected and a predetermined error response occurs, the error response being dependent in particular on the digital signal converted from the predetermined analog signal.

8. The method according to claim 6, wherein an error response occurs when in the comparison, no correspondence is achieved within a predeterminable tolerance.

9. The method according to claim 6, wherein an error response occurs when in the comparison, a correspondence is achieved within a predeterminable tolerance.

10. The method according to claim 1, wherein at least two analog signals are suppliable to the analog-digital converter for conversion and only exactly one reference voltage is assigned to at least one of the at least two analog signals for conversion.

11. The method according to claim 1, wherein at least one first analog signal is converted as a first group of first signals to which only exactly one reference voltage is assigned for conversion, and at least one second analog signal is converted as a second group of second signals to which at least two reference voltages are assignable for conversion.

12. The method according to claim 11, wherein the first group of first analog signals is assigned to a first analog-digital converter (ADC1) and the second group of second analog signals is assigned to a second analog-digital converter (ADC2).

13. The method according to claim 1, wherein the function test is performed on a predetermined analog test signal.

14. The method according to claim 1, wherein the function test is performed exclusively on a predetermined analog test signal.

15. The method according to claim 1, wherein the analog-digital converter is operaable in two modes, a first mode allowing the use of different reference voltages for conversion and a second mode allowing only one reference voltage for conversion.

16. The method according to claim 1, wherein at least two values for different reference voltages are stored in a table in a memory and one reference voltage is predetermined for use in the conversion by selecting a value.

17. The method according to claim 11, wherein the function test is performed only for the first group of first analog signals.

18. A device having an analog-digital converter for function testing the analog-digital converter, the analog-digital converter performing a function for converting at least one analog signal into at least one digital signal using a first predetermined reference voltage, wherein the analog-digital converter is able to perform the function alternatively using at least one other reference voltage, in particular a predetermined second reference voltage, first means being included which block the analog-digital converter so that use of at least the other reference voltage, in particular the second reference voltage, by the analog-digital converter is prevented, a predetermined analog signal being converted into a digital signal for the function test, and second means being included that analyze the digital signal formed by the conversion.

19. An analog-digital converter having means for function testing of same, the analog-digital converter performing a function for converting at least one analog signal into at least one digital signal using a first predetermined reference voltage, wherein the analog-digital converter is able to perform the function alternatively using at least one other reference voltage, in particular a predetermined second reference voltage, first means being included which block the analog-digital converter so that use of at least the other reference voltage, in particular the second reference voltage, by the analog-digital converter is prevented, a predetermined analog signal being converted into a digital signal for the function test, and second means being included that analyze the digital signal formed by the conversion.

* * * * *